United States Patent [19]
Kaido et al.

[11] Patent Number: 5,217,921
[45] Date of Patent: Jun. 8, 1993

[54] METHOD OF PHOTOVOLTAIC DEVICE MANUFACTURE

[75] Inventors: Yoshinori Kaido, Tsuna; Otsuki Masatoshi, Sumoto, both of Japan

[73] Assignee: Sanyo Electric Co., Ltd., Osaka, Japan

[21] Appl. No.: 886,924

[22] Filed: May 22, 1992

[30] Foreign Application Priority Data

May 23, 1991 [JP] Japan ................................ 3-118817

[51] Int. Cl.$^5$ .................................... H01L 21/268
[52] U.S. Cl. .................................... 437/173; 437/4
[58] Field of Search ............... 437/173, 4, 2; 136/256, 136/261

[56] References Cited

U.S. PATENT DOCUMENTS

| | | |
|---|---|---|
| 4,292,092 | 9/1981 | Hanak . |
| 4,783,421 | 11/1988 | Carlson et al. ........... 437/173 |
| 4,854,974 | 8/1989 | Carlson et al. ........... 136/244 |
| 4,954,181 | 9/1990 | Nishiura et al. ........... 437/173 |

FOREIGN PATENT DOCUMENTS 57-12568 1/1982 Japan .
62-33477 2/1987 Japan .

Primary Examiner—Brian E. Hearn
Assistant Examiner—Linda J. Fleck
Attorney, Agent, or Firm—Wenderoth, Lind & Ponack

[57] ABSTRACT

This method of photovoltaic device manufacture has process steps to form a transparent electrode layer comprising at least a tin oxide layer on a transparent substrate, to divide the transparent electrode layer into a plurality of unit areas by laser scribing, and to subsequently heat treat (anneal) the device. The laser for scribing the transparent electrode layer into a plurality of unit areas has an energy density greater than or equal to 21 J/cm$^2$. Further, when the diameter of the laser beam spot on the transparent electrode layer is D and the distance between pulses is X, the laser satisfies the condition $0.5\,D \leq X \leq 0.85\,D$.

4 Claims, 8 Drawing Sheets

METHOD OF PHOTOVOLTAIC DEVICE MANUFACTURE

BACKGROUND OF THE INVENTION

This invention relates to a method of photovoltaic device manufacture wherein a plurality of cells are connected in series at interconnect sites. It is critical to make the interconnect sites, where cells fabricated on a single transparent substrate are joined in series, as small as possible to maximize the effective power producing area of the photovoltaic device. Prior art which attains this objective by laser scribing cell interconnect sites is described by Japanese public disclosure 33477 (1987).

The series connected photovoltaic device fabrication technique described by this public disclosure is as follows. A transparent electrode layer 2 is established over the entire surface of a glass substrate 1 (FIG. 1). After dividing the electrode layer into a plurality of unit areas via laser scribe A (FIG. 2), lines of conducting paste 5 and insulating paste 6 are provided adjacent to the dividing cuts 3 (FIG. 3). Further, after annealing the paste, an amorphous silicon layer 7 and a surface electrode layer 8 are formed (FIG. 4). Finally, by laser scribing over the conducting paste 5, the surface electrodes 8 and transparent electrodes 2 of adjacent cells 2a, 2b, and 2c are connected electrically, and by laser scribing over the insulating paste 6, the surface electrode layer 8 and the amorphous silicon layer 7 are cut (FIG. 5) thereby connecting separate cells 2a, 2b, and 2c in series.

However, since this method also heats the transparent electrode layer 2 when the conducting paste 5 and insulating paste 6 are annealed, the transparent electrode layer 2 divided into unit areas by laser scribing can become reconnected, shorting cell divisions and reducing power conversion efficiency.

The present invention provides a method of photoelectric device manufacture in which the transparent electrode layer does not become reconnected as in the case of the former method described above.

SUMMARY OF THE INVENTION

The method of photovoltaic device manufacture of this invention comprises a process step to form a transparent electrode layer such as tin oxide (TCO, transparent conductive oxide) over the entire transparent substrate, a step to divide the transparent electrode layer into a plurality of unit areas by laser scribing, steps to establish and anneal lines of conducting paste and insulating paste on the transparent electrode layer adjacent to scribe cuts, steps to form an amorphous silicon layer and a surface electrode layer over the entire transparent electrode surface, and a step to laser scribe over the surface electrode along the conducting paste and the insulating paste defining a plurality of cells and at the same time connecting them in series. The laser for scribing the transparent electrode layer and dividing it into a plurality of unit areas must satisfy the following requirements. The laser is a pulsed laser. The energy density of the laser beam incident on the transparent electrode layer is greater than or equal to 21 J/cm². When the diameter of the laser beam incident on the transparent electrode layer is D and the distance between pulses of the scribing laser beam on the transparent electrode layer is X, the laser beam must satisfy the relation $0.5 D \leq X \leq 0.85 D$.

When the above relation between the laser beam diameter D and the distance between pulses X is satisfied, it turns out that the plurality of unit areas laser scribed from the transparent electrode layer are difficult to reconnect even with annealing. It is believed that when the tin oxide comprising the transparent electrode is laser scribed, conducting $SnO_2$ is converted to insulating SnO, and SnO is converted back to $SnO_2$ during annealing. Therefore, it is critical to establish conditions that make it as difficult as possible to form SnO when laser scribing the transparent electrode layer.

DETAILED DESCRIPTION OF THE INVENTION

Figure 1:
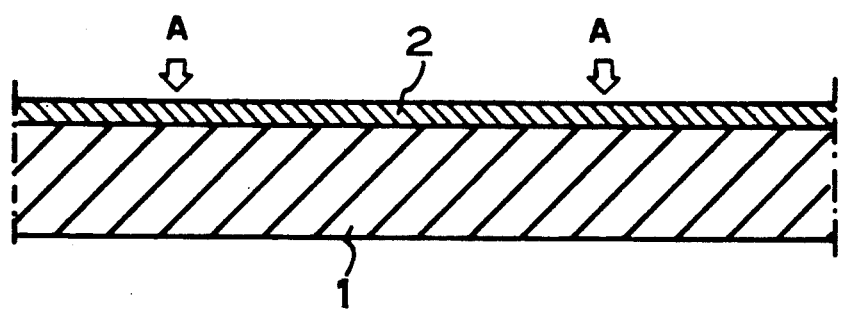
FIG. 1 through FIG. 5 are cross-sectional views showing the fabrication process sequence of the present invention and prior art photovoltaic devices.
Figure 2:
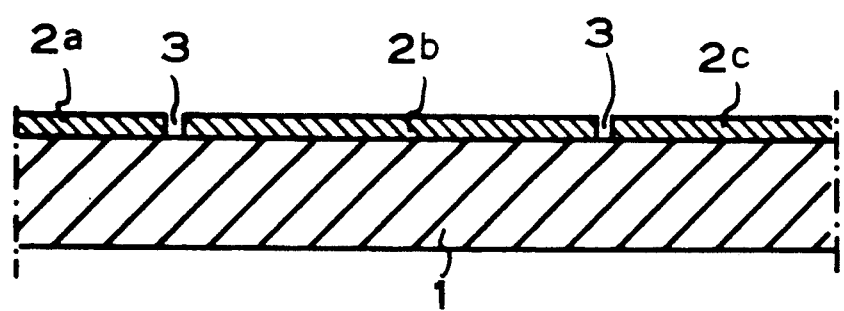
Figure 3:
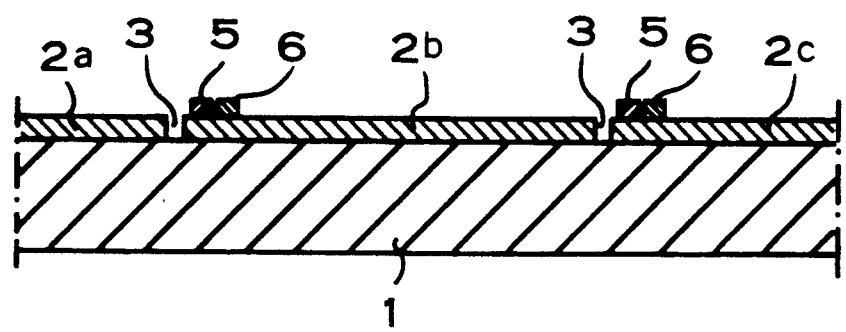
Figure 4:
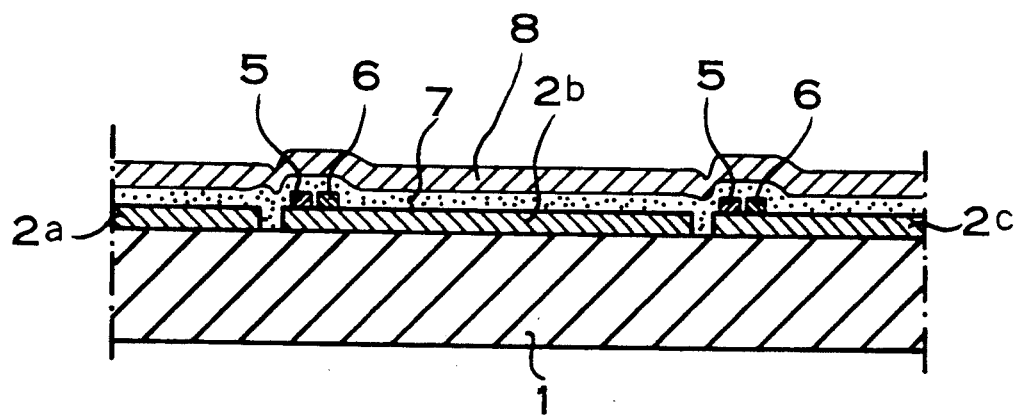
Figure 5:
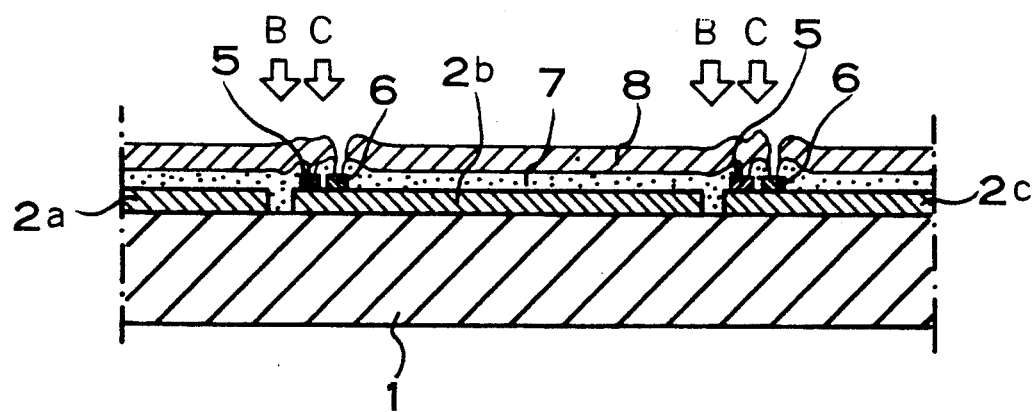
Figure 6:
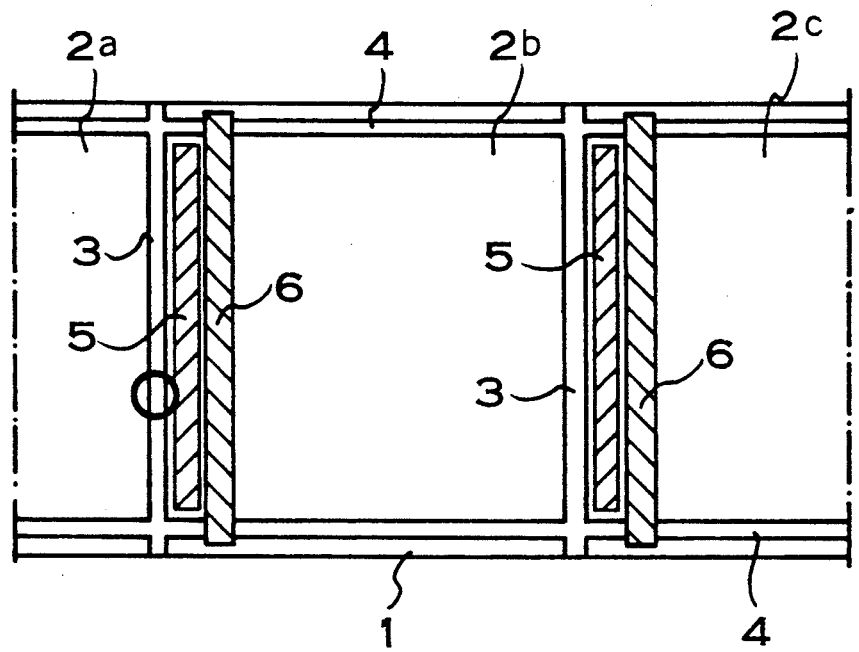
FIG. 6 is a plan view showing conducting paste and insulating paste fixed to the divided transparent electrode layer.

The method of manufacture of the present invention fabricates photovoltaic devices, similar to former methods, as shown in FIG. 1 through FIG. 5. In the method of manufacture of the present invention a tin oxide transparent electrode layer 2 is established over the entire surface of a glass substrate 1. This transparent electrode layer is divided into a plurality of unit areas 2a, 2b, and 2c by scribing with laser beam A. At the same time laser scribe cuts are provided along the long sides of the glass substrate 1. In FIG. 6, laser scribe cuts which divide the unit areas 2a, 2b, and 2c are labeled 3, and cuts along the long sides of the glass substrate 1 are labeled 4.

After laser scribing, lines of conducting paste 5 and insulating paste 6 are provided on each cell 2a, 2b, and 2c along side the cuts 3.

Next, the amorphous silicon layer 7 active region is formed in a 250° C. plasma. Then after establishing a surface electrode layer 8, the conducting paste 5 and insulating paste 6 described above are scribed over by laser beams B and C incident on the surface electrode layer. Laser beam B scribes over the conducting paste 5 melting the surface electrode 8, which goes through the amorphous silicon layer 7, thereby connecting the surface electrode layer 8 with the conducting paste 5. Laser beam C scribes over the insulating paste 6 dividing the surface electrode layer 8 and the amorphous silicon layer 7 to the left and right of the scribe cut. By doing this, a plurality of cells are formed and at the same time are electrically connected in series.

Since the laser beams A, B, and C are pulsed beams with high peaks, it is desirable to use Q-switched YAG lasers with a wavelength of approximately 1.06 μm. Often, after scribing 2500 to 6000 angstroms of transparent electrode layer 2 with a YAG laser to form dividing cuts 3 and edge cuts 4, followed by the conducting paste 5 and insulating paste 6 anneal at approximately 550° C., the divided transparent electrode layer 2 once again becomes electrically connected.

Figure 7:
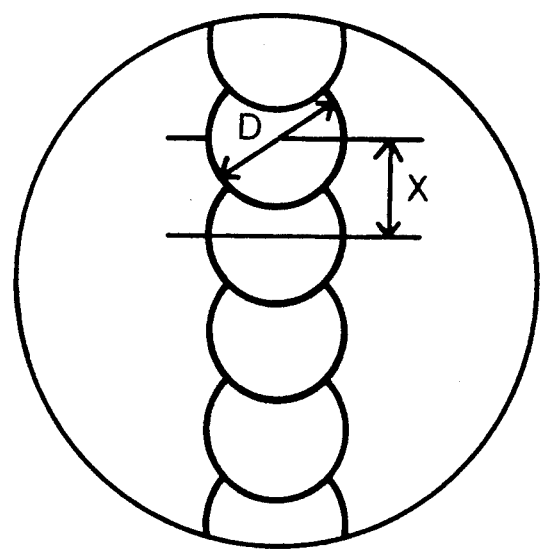
FIG. 7 is an enlarged plan view showing the laser beam pulse incident on the transparent electrode layer.

Turning to FIG. 7, the scribing laser beam on the transparent electrode layer is illustrated. As shown in this figure, the laser pulses over the transparent electrode layer with a beam diameter D and distance between pulses X.

Figure 8:
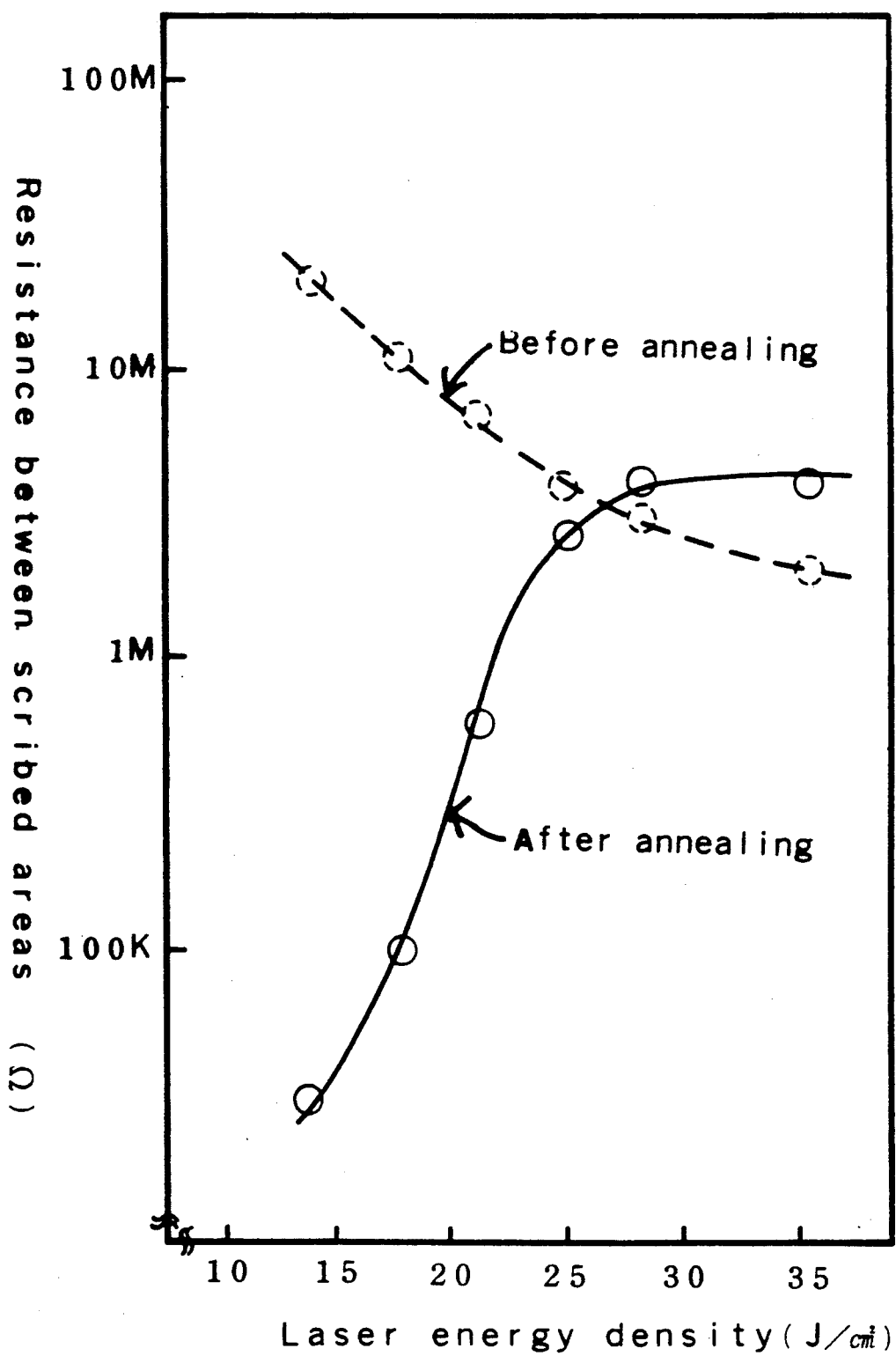
FIG. 8 is a graph showing resistance between scribed areas of the transparent electrode layer versus laser energy density.

The conditions required for a laser to completely cut through and divide the transparent electrode layer 2 have been investigated. The energy density of the laser beam scribing the transparent electrode layer 2 was varied. Then the resistance between unit areas of the transparent electrode layer 2, for example 2a, 2b, and 2c, in other words the resistance across the scribe cuts 3, was measured before and after annealing and its change observed. The results are shown in FIG. 8. In this figure, the broken line data are before annealing and the solid line data are after annealing. The data for this graph, however, were taken under the condition X/D=0.56. In this graph, the larger the laser beam energy density, the lower the scribe cut resistance before annealing. Further, the slopes of the curves before and after annealing are opposite.

Reduction in scribe cut resistance with increasing laser beam energy density before annealing can be explained as follows. Laser beam radiation converts $SnO_2$ of the transparent electrode layer 2 to insulating $SnO$. However, when the laser energy becomes large, the amount of energy that passes through the transparent electrode layer 2 into the glass substrate 1 increases, and impurities in the glass substrate are vaporized. It is believed that deposition of these impurities on the surface of the $SnO$ is responsible for the reduction in scribe cut resistance.

Further, slope reversal after annealing is due to conversion of insulating $SnO$, created by laser scribing, back to conducting $SnO_2$ during annealing. At large energy densities, the transparent electrode layer 2 is cleanly severed by the scribe cut and even if $SnO$ is converted back to $SnO_2$, little change in scribe cut resistance is observed. Larger resistance after annealing than before at large energy densities is thought to be due to the conversion of conducting impurities, deposited during laser scribing, to insulators during annealing.

Since at least 1M $\Omega$ resistance between isolated areas of the photovoltaic device is required, it is sufficient to set laser beam energy density greater than or equal to approximately 21 $J/cm^2$.

Figure 9:
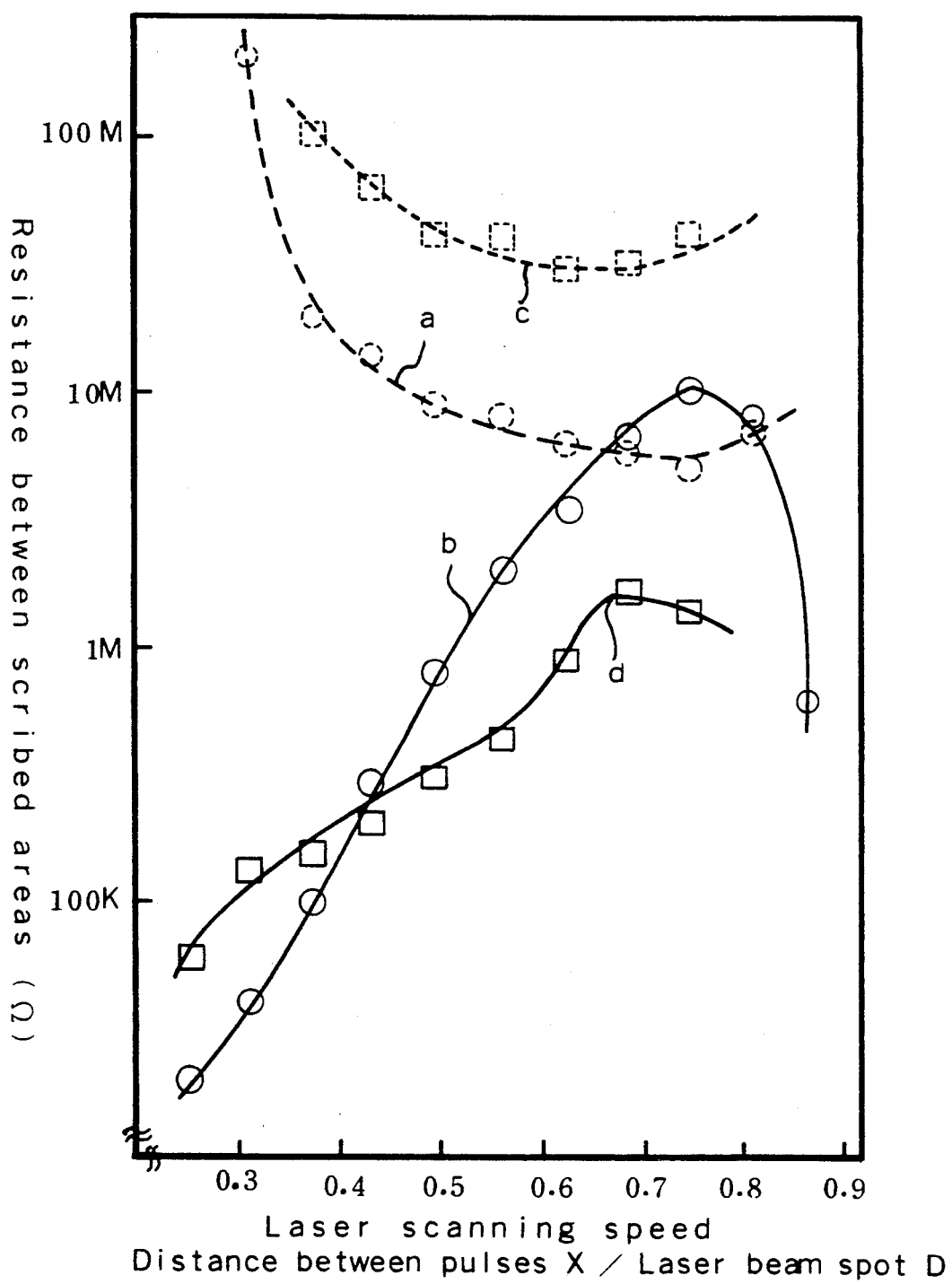
FIG. 9 is a graph showing resistance between scribed areas of the transparent electrode layer versus laser scanning speed.

In FIG. 9 resistance across the scribe cut is shown as a function of the pulsed laser beam scanning speed. The pulsed laser beam scanning speed is expressed as the ratio of the distance the laser beam spot moves in one pulse X to the laser beam spot diameter D. Curves a and b through ○ symbols represent resistance of scribe cuts through the transparent electrode layer 2 with a laser beam energy density of 24 $J/cm^2$. Curves c and d through □ symbols represent resistance of scribe cuts through the transparent electrode layer 2 with a laser beam energy density of 19 $J/cm^2$. Further, the broken line curves a and c are resistances before annealing and the solid line curves b and d are resistances after annealing.

This graph shows that scribe cut resistance prior to annealing at first decreases with laser beam scanning speed then increases. This can be explained as follows.

When the transparent electrode layer 2 is laser scribed, energy at the center of the scribing beam is large, and consequently the $SnO_2$ of the transparent electrode layer is completely vaporized. However, outside the beam center the laser energy is small, and conducting $SnO_2$ is not vaporized, but rather is converted to insulating $SnO$. Further, once the $SnO_2$ has been converted to $SnO$, it does not change further even though exposed to the high energy beam center. The reason for this is that the $SnO$ layer produced is extremely thin, and therefore, cannot absorb the laser energy which passes through it. Consequently, when laser scanning speed is slow, the region outside the beam center is converted to $SnO$, and when the beam center subsequently passes over the same region, the state of the $SnO$ does not change. Hence, it is believed that large amounts of $SnO$ are produced resulting in large scribe cut resistance.

When laser scanning speed is increased somewhat, regions not irradiated by the previous pulse are irradiated by the beam center of the following pulse, thereby vaporizing $SnO_2$ and exposing the glass substrate 1. As described previously, exposure of the glass substrate to laser energy results in the deposition of conducting impurities on the surface, thereby reducing resistance.

When laser scanning speed is further increased, the number of number of pulses which cut through the transparent electrode layer 2 is reduced and the area of glass substrate exposed is reduced. Therefore, the amount of deposited impurities is reduced and resistance once again increases.

Figure 10:
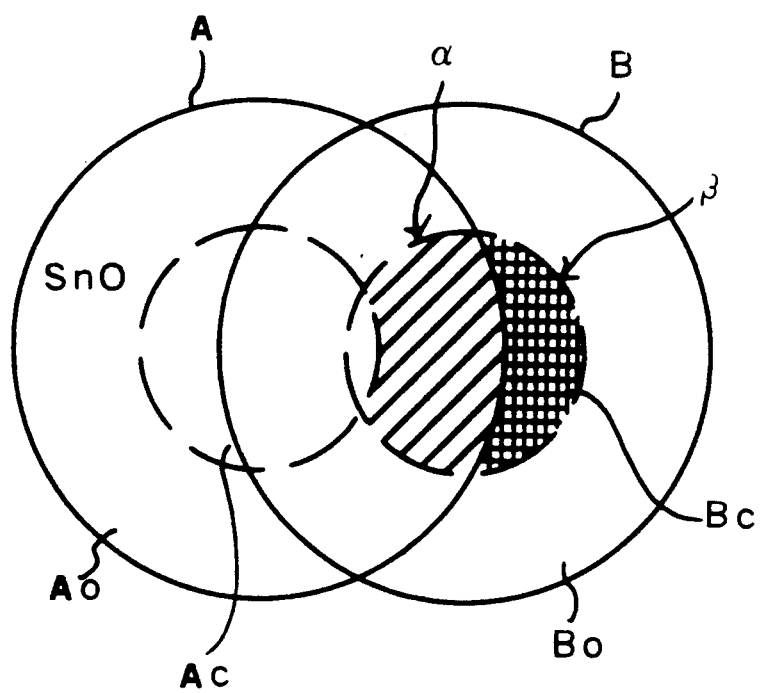
FIG. 10 through FIG. 12 are enlarged plan views showing portions of the laser scribed transparent electrode layer where SnO remains.

Slope reversal of the broken line curves a and c with annealing of the transparent electrode layer is based on the same reason given for FIG. 8 In FIG. 10, circle A indicates the first area irradiated by the laser beam, and circle B indicates the next area irradiated by the laser beam. In the first irradiated area A, $SnO_2$ is vaporized from the center region Ac, however $SnO_2$ is not vaporized but converted to $SnO$ in the peripheral region Ao. In the next irradiated area B, the center region Bc is irradiated by the high energy central portion of the laser beam. However, $SnO$ in region $\alpha$, including the center region Bc, remains unvaporized. In area B, $SnO$ remains in region $\alpha$, while $SnO_2$ is vaporized from region $\beta$.

Figure 11:
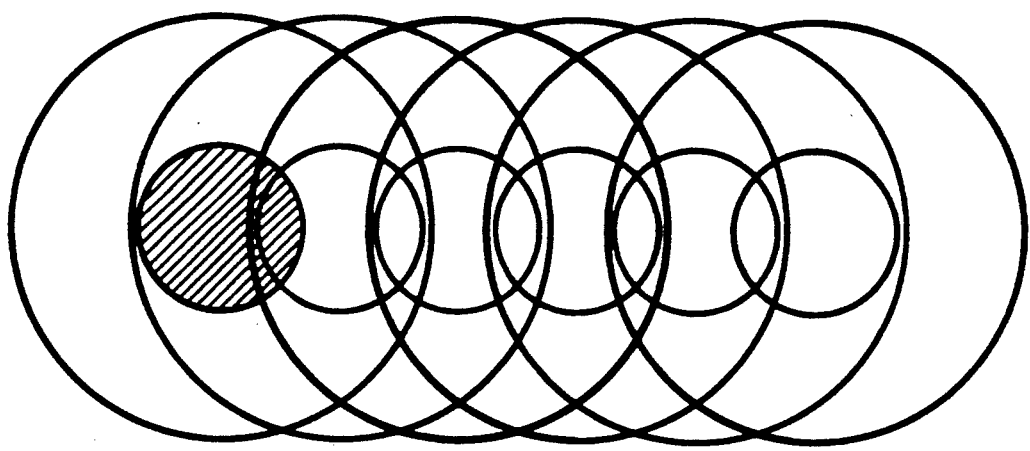

The scribe cut resistance after annealing is increased by increasing the regions where $SnO_2$ is vaporized. However, it is impossible to eliminate $SnO$ production in this process. The present invention's X/D requirements are based on how much the $SnO$ regions can be reduced. When the distance between laser beam spots is small, (slow scanning speed), as shown in FIG. 11, except for the center of the first spot (hatched area), $SnO$ is created. Since $SnO$ is converted back to $SnO_2$ by annealing, resistance is greatly reduced.

Figure 12:
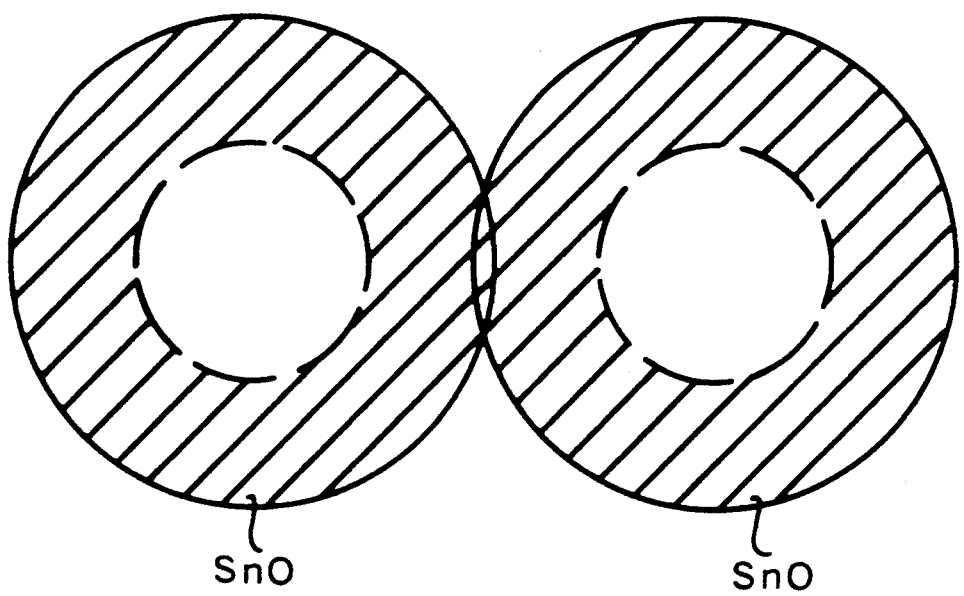

When the distance between laser beam spots becomes large, (fast scanning speed), as shown in FIG. 12, regions where $SnO_2$ is vaporized exist, but regions of $SnO$ are sufficiently more numerous to cause large resistance reduction after annealing. Therefore, as shown in FIG. 12, to maximize scribe cut resistance it is necessary to maximize the size of the region $\alpha$, where the previous pulse does not irradiate and the center of following pulse does irradiate. In other words it is necessary to maximize the size of the region where $SnO_2$ is vaporized. It should be noted however, as shown in FIG. 12, that when the distance between laser beam spots becomes too large, the regions where $SnO$ remain become numerous, and resistance drops.

Here the use of a laser beam with an energy density of 24J/cm² is considered, and since the resistance between divisions of the photovoltaic device is required to be greater than or equal to 1MΩ, an acceptable laser scanning speed is obtained for 0.5 D≦X≦0.85 D.

As shown above, in this method, the transparent electrode layer is divided by laser scribing with a YAG laser having a wavelength of approximately 1.06 μm, an energy density greater than or equal to 21J/cm², and a scanning speed such that 0.5 D≦X≦0.85 D. After laser scribing the transparent electrode layer, conducting paste and insulating paste are applied and annealed. With this method, even after annealing, the divided transparent electrode layer is not reconnected, and a readily manufacturable photovoltaic device with large power conversion efficiency can be fabricated.

In the method of photovoltaic device manufacture of the present invention, the diameter of the laser beam spot on the transparent electrode layer D is not limited, but it is selected to be, for example, approximately 50 μm. The laser scribed region of the transparent electrode layer steps down in thickness showing a clear boundary between the irradiated and non-irradiated regions. In this application, the diameter of the laser beam spot D is defined to be that region of the irradiated transparent electrode layer which becomes less than or equal to 10% of the original transparent electrode film thickness.

We claim:

1. A method of photovoltaic device manufacture comprising:
    (a) a process to form a transparent electrode layer of at least a tin oxide layer on a transparent substrate;
    (b) a process to divide the transparent electrode layer into a plurality of unit areas by laser scribing; and including
    (c) a subsequent heat treatment (annealing) process; characterized in that the laser for scribing said transparent electrode layer into a plurality of unit areas has a pulse with energy density greater than or equal to 21 J/cm², and when the diameter of the laser beam spot on the transparent electrode layer is D and the distance between pulses is X it is set in the range 0.5 D≦X≦0.85 D.

2. A method of photovoltaic device manufacture comprising:
    (a) a process to form a transparent electrode layer of at least a tin oxide layer on the surface of a transparent substrate;
    (b) a process to divide the transparent electrode layer into a plurality of unit areas by laser scribing;
    (c) a process to provide conducting paste and insulating paste on the transparent electrode layer along side the dividing scribe cut;
    (d) a process to anneal the conducting and insulating paste;
    (e) a process to form an amorphous silicon layer and surface electrode layer on the surface of said transparent electrode layer; and
    (f) a process to divide the photovoltaic device into a plurality of cells and at the same time connect them in series by laser scribing over said surface electrode layer along the conducting paste and insulating paste;
characterized in that the laser for scribing said transparent electrode layer into a plurality of unit areas has a pulse with energy density greater than or equal to 21 J/cm², and when the diameter of the laser beam spot on the transparent electrode layer is D and the distance between pulses is X it is set in the range 0.5 D≦X≦0.85 D.

3. A method of photovoltaic device manufacture as recited in claim 1 wherein the laser beam is a 1.06 μm wavelength YAG laser.

4. A method of photovoltaic device manufacture as recited in claim 2 wherein the laser beam is a 1.06 μm wavelength YAG laser.

* * * * *